(12) United States Patent
Yasui

(10) Patent No.: US 10,729,048 B2
(45) Date of Patent: Jul. 28, 2020

(54) OPTIMIZATION PROGRAM AND MOUNTING WORK SYSTEM

(71) Applicant: FUJI CORPORATION, Chiryu (JP)

(72) Inventor: Yoshihiro Yasui, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 234 days.

(21) Appl. No.: 15/305,174

(22) PCT Filed: Apr. 24, 2014

(86) PCT No.: PCT/JP2014/061556
§ 371 (c)(1),
(2) Date: Oct. 19, 2016

(87) PCT Pub. No.: WO2015/162751
PCT Pub. Date: Oct. 29, 2015

(65) Prior Publication Data
US 2017/0042072 A1 Feb. 9, 2017

(51) Int. Cl.
*H05K 13/04* (2006.01)
*H05K 13/08* (2006.01)

(52) U.S. Cl.
CPC ......... *H05K 13/04* (2013.01); *H05K 13/0452* (2013.01); *H05K 13/0495* (2013.01);
(Continued)

(58) Field of Classification Search
CPC ......... Y10T 29/53144; Y10T 29/53178; Y10T 29/53183; Y10T 29/53187; H05K 3/0097;
(Continued)

(56) References Cited

U.S. PATENT DOCUMENTS 6,223,428 B1 5/2001 Nonaka et al.
6,842,974 B1 1/2005 Maenishi et al.
(Continued)

FOREIGN PATENT DOCUMENTS

CN 1312674 A 9/2001
EP 1 227 711 A1 7/2002
(Continued)

OTHER PUBLICATIONS

Machine Translation of JP 2005-072317 retrieved from EPO website (Espacenet.conn) on Sep. 17, 2019 (Year: 2005).*
(Continued)

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

With multiple-board substrate defined as a circuit substrate provided with multiple boards of circuit pattern on which multiple electronic components are mounted, when performing mounting work of multiple electronic components on a multiple-board substrate using three mounters lined up in a row, electronic component mounting work procedures are set such that mounting work of electronic components for each of multiple circuit patterns is performed by all three mounters. Work procedures for mounting work of electronic components surrounded by the dashed lines are set to a first mounter, work procedures for mounting work of electronic components surrounded by the single-dashed solid lines are set to a second mounter, and work procedures for mounting work of electronic components surrounded by the double-dashed solid lines are set to a third mounter.

4 Claims, 10 Drawing Sheets

(52) U.S. Cl.
CPC ........... *H05K 13/08* (2013.01); *H05K 13/085* (2018.08); *Y10T 29/53174* (2015.01); *Y10T 29/53187* (2015.01)

(58) Field of Classification Search
CPC ............... H05K 13/04; H05K 13/0404; H05K 13/0411; H05K 13/0452; H05K 13/0495; H05K 13/08; H05K 13/0815; H05K 13/085; H05K 13/0882
See application file for complete search history.

(56) References Cited

U.S. PATENT DOCUMENTS

| | | | |
|---|---|---|---|
| 2001/0032030 A1 | 10/2001 | Nakahara et al. | |
| 2006/0229758 A1 | 10/2006 | Maenishi et al. | |

FOREIGN PATENT DOCUMENTS

| | | | |
|---|---|---|---|
| JP | 9-051193 A | 2/1997 | |
| JP | 3474682 B2 | 12/2003 | |
| JP | 2005-072317 A | 3/2005 | |
| JP | 2009-099886 A | 5/2009 | |
| JP | 2011-216797 A | 10/2011 | |
| JP | 2012-160627 A | 8/2012 | |
| WO | 2014/030255 A1 | 2/2014 | |

OTHER PUBLICATIONS

Office Action dated Aug. 24, 2018 in Chinese Patent Application No. 201480078091.9, 7 pages (submitting English translation of the Office Action only).
International Search Report dated Jul. 15, 2014 in PCT/JP2014/061556, filed Apr. 24, 2014.
Extended European Search Report dated Apr. 19, 2017 in European Patent Application No. 14890427.9.
Japanese Office Action dated Nov. 28, 2017 in Patent Application No. 2016-514636 (with English Translation).
Office Action dated Aug. 7, 2018 in Japanese Patent Application No. 2016-514636 submitting unedited computer generated English translation only.

* cited by examiner

First mounter: R1(1) R1(2) R1(3)

Second mounter: R2(1) R2(2) R2(3) | R3(1) R3(2) R3(3)

Third mounter: R4(1) R4(2) R4(3) | R5(1) R5(2) R5(3) | R6(1) R6(2) R6(3)

| JobName | Side | No defective circuit patterns (seconds) | First defective circuit pattern (seconds) | Second defective circuit pattern (seconds) | Third defective circuit pattern (seconds) | Average (seconds) | Reduction ratio |
|---|---|---|---|---|---|---|---|
| JOB1 | Top | 23.36 | 23.94 | 20.64 | 23.38 | 22.65 | 3.03% |
|  | Bottom | 32.65 | 30.82 | 27.62 | 28.14 | 28.86 | 11.61% |
| JOB2 | Top | 24.36 | 23.94 | 20.64 | 23.38 | 22.65 | 7.01% |
|  | Bottom | 30.84 | 28.93 | 26.70 | 29.63 | 28.42 | 7.85% |
| JOB3 | Top | 25.00 | 23.58 | 21.60 | 24.40 | 23.19 | 7.23% |
|  | Bottom | 31.62 | 31.19 | 29.09 | 26.47 | 28.92 | 8.55% |
| JOB4 | Top | 25.00 | 23.58 | 21.60 | 24.40 | 23.19 | 7.23% |
|  | Bottom | 31.62 | 31.19 | 29.09 | 26.47 | 28.92 | 8.55% |
| JOB5 | Top | 26.09 | 17.70 | 17.66 | 17.66 | 17.67 | 32.26% |
|  | Bottom | 31.01 | 30.39 | 26.08 | 26.35 | 27.61 | 10.97% |

FIG. 10

| JobName | Side | No defective circuit patterns (seconds) | First defective circuit pattern (seconds) | Second defective circuit pattern (seconds) | Third defective circuit pattern (seconds) | Average (seconds) | Reduction ratio |
|---|---|---|---|---|---|---|---|
| JOB1 | Top | 25.66 | 18.58 | 20.17 | 19.03 | 19.26 | 24.94% |
| | Bottom | 36.18 | 25.26 | 25.24 | 25.00 | 25.17 | 30.44% |
| JOB2 | Top | 25.66 | 18.58 | 20.17 | 19.03 | 19.26 | 24.94% |
| | Bottom | 32.42 | 23.41 | 24.03 | 23.27 | 23.57 | 27.30% |
| JOB3 | Top | 25.97 | 18.99 | 20.38 | 19.18 | 19.52 | 24.85% |
| | Bottom | 32.74 | 23.30 | 24.83 | 23.66 | 23.93 | 26.91% |
| JOB4 | Top | 25.97 | 18.99 | 20.38 | 19.18 | 19.52 | 24.85% |
| | Bottom | 32.74 | 23.30 | 24.83 | 23.66 | 23.93 | 26.91% |
| JOB5 | Top | 26.09 | 17.70 | 17.66 | 17.66 | 17.67 | 32.26% |
| | Bottom | 31.11 | 23.92 | 24.21 | 23.86 | 24.00 | 22.87% |

OPTIMIZATION PROGRAM AND MOUNTING WORK SYSTEM

TECHNICAL FIELD

This application relates to a mounting work system in which mounting work is sequentially performed on circuit substrates being conveyed, and an optimization program that optimizes the mounting work for each work machine in the system.

BACKGROUND ART

A mounting work system is usually provided with multiple mounting work machines lined up, and circuit substrates are conveyed from an upstream side of the multiple mounting work machines to a downstream side. For mounting work performed by the multiple mounting work machines with respect to the circuit substrates, because multiple electronic components are mounted on a circuit substrate, mounting work of mounting multiple electronic components on the circuit substrate is divided between each of the multiple mounting work machines. In other words, mounting procedures for mounting the multiple electronic components on the circuit substrate (hereinafter also referred to simply as "work procedure") are set as work data to the multiple mounting work machines.

Further, among circuit substrates, there are circuit substrates that are provided with multiple boards on one circuit substrate, in which multiple electronic circuit board patterns (hereinafter sometimes referred to as "circuit pattern") on which multiple electronic components are to be mounted are provided; and these multiple-board substrates sometimes include a circuit pattern that is not in good condition (hereinafter sometimes referred to as "defective circuit pattern"). For these multiple-board substrates that include a defective circuit pattern, mounting work to the defective circuit pattern can be skipped during mounting work, and it is desirable to improve throughput of substrate work system 10 as much as possible. For this, as disclosed in the following patent literature, development has progressed of work procedure settings means for improving throughput when performing mounting work on multiple-board substrates that include a defective circuit pattern.

CITATION LIST

Patent Literature

Patent Literature 1: JP-A-2011-216797
Patent Literature 2: JP-A-2009-99886
Patent Literature 3: JP-A-H9-51193

SUMMARY

According to the technology disclosed in the above patent literature, it is possible to improve to some extent the throughput when performing mounting work on multiple-board substrates that include a defective circuit pattern. However, it is desirable to further improve throughput. This disclosure takes account of such circumstances and an object thereof is to further improve the throughput when performing mounting work on multiple-board substrates that include a defective circuit pattern.

Solution to Problem

To solve the above problems, disclosed in an embodiment is an optimization program for optimizing work of mounting electronic components, including: a setting device that sets a mounting work procedure of mounting electronic components to an electronic circuit board pattern for each of multiple mounting work machines such that mounting work of multiple electronic components to each of multiple of the electronic circuit board patterns is performed by all of the multiple mounting work machines, the optimization program being for a mounting work system provided with multiple of the mounting work machines lined up in a row, with multiple-board printed panels being conveyed in the mounting work system from an upstream side of the multiple mounting work machines to a downstream side, the multiple-board printed panel being defined as a panel with multiple boards provided with an electronic circuit board pattern to be mounted with multiple of the electronic components.

The optimization program disclosed in another embodiment is the optimization program according to claim 1, wherein the setting device sets the mounting work procedure of mounting electronic components to the electronic circuit board pattern for each of the multiple mounting work machines such that the total time for work of mounting the electronic components to the electronic circuit board pattern is equalized for each of the multiple mounting work machines.

The optimization program further disclosed in another embodiment is the optimization program according to claim 1 or 2, wherein the setting device sets the mounting work procedure of mounting electronic components to the electronic circuit board pattern for each of the multiple mounting work machines according to the quantity of electronic components per unit of time to be mounted to the electronic circuit board pattern by each of the multiple mounting work machines.

Disclosed in embodiment is a mounting work system including: multiple mounting work machines lined up in a row; and a control device that controls operation of the multiple mounting work machines, wherein multiple-board printed panels are conveyed in the mounting work system from an upstream side of the multiple mounting work machines to a downstream side, the multiple-board printed panel being defined as a panel with multiple boards provided with an electronic circuit board pattern to be mounted with multiple of the electronic component, and wherein the control device controls operation of the multiple mounting work machines such that the electronic components are mounted the electronic circuit board pattern according to a mounting work procedure of mounting electronic components to the electronic circuit board pattern for each of the multiple mounting work machines such that work of mounting the multiple electronic components of each of the multiple electronic circuit board patterns is performed by all of the multiple mounting work machines.

Effects

Advantageous Effects of Invention

With the optimization program disclosed in an embodiment and the mounting work system disclosed in claim 4, the mounting work procedure of mounting electronic components to an electronic circuit board pattern for each of multiple mounting work machines is set such that work of mounting multiple electronic components onto each of the multiple electronic circuit board patterns is performed by all of the multiple mounting work machines. Accordingly, in a case in which mounting work onto a defective circuit pattern is not performed, for all of the mounting work machines, the time required for mounting by the mounting work machine is reduced by the time required for mounting work of the defective circuit pattern, thus the throughput of substrate work system 10 is improved.

Further, with the optimization program disclosed in another embodiment, the mounting work procedure of mounting electronic components to the electronic circuit board pattern for each of the multiple mounting work machines is set such that the total time for work of mounting the electronic components to the electronic circuit board pattern is equalized for each of the multiple mounting work machines. By this, it is possible to virtually eliminate waiting time of the mounting work machines that arises due to not performing mounting work to defective circuit patterns, thus significantly improving the throughput of substrate work system 10.

Further, with the optimization program further disclosed in another embodiment, the mounting work procedure of mounting electronic components to the electronic circuit board pattern for each of the multiple mounting work machines is set according to the quantity of electronic components per unit of time to be mounted to the electronic circuit board pattern by each of the multiple mounting work machines. By this, a larger amount of the work procedure is set to be performed by mounting work machines with high mounting performance, and a smaller amount of the work procedure is set to be performed by mounting work machines with low mounting performance, thus the time required for mounting work of each of the multiple mounting work machines is equalized.

BRIEF DESCRIPTION OF DRAWINGS

FIG. 7A is a conceptual diagram showing the method for setting the mounting work procedure for multiple mounters when mounting electronic components to multiple-board substrates.

FIG. 7B is a conceptual diagram showing the method for setting the mounting work procedure for multiple mounters when mounting electronic components to multiple-board substrates.

FIG. 7C is a conceptual diagram showing the method for setting the mounting work procedure for multiple mounters when mounting electronic components to multiple-board substrates.

FIG. 9 shows the work time and reduction ratio when mounting work is performed according to the mounting work procedure set by a conventional method.

FIG. 10 shows the work time and reduction ratio when mounting work is performed according to the mounting work procedure set by a method of this disclosure.

DESCRIPTION OF EMBODIMENTS

Description of Preferred Embodiments

The following describes in detail referring to the figures an example embodiment of this disclosure.

Configuration of Substrate Work System

Figure 1:
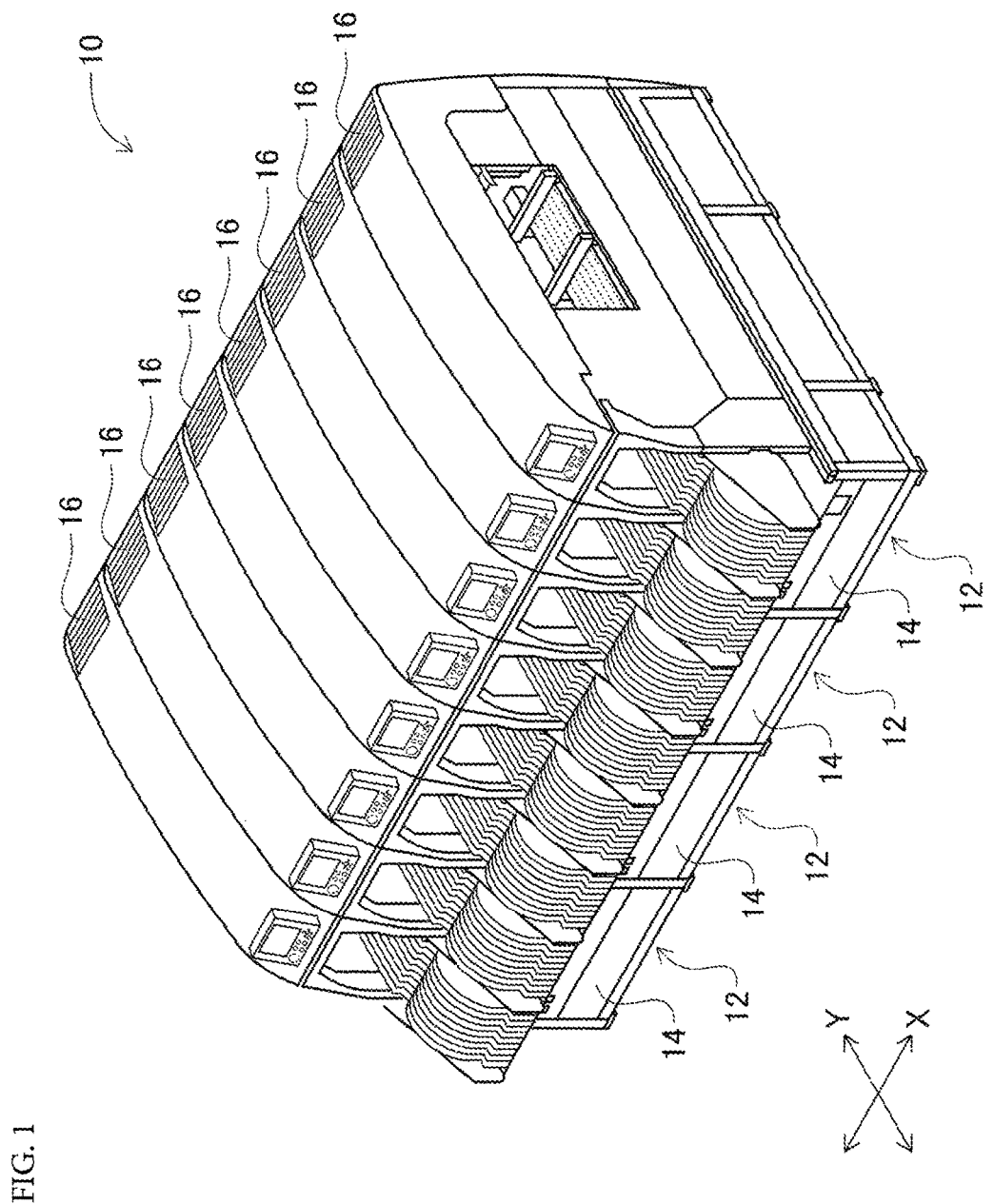
FIG. 1 is a perspective view showing a substrate work system that is an embodiment of this disclosure.

FIG. 1 shows substrate work system 10. System 10 shown in FIG. 1 is for mounting electronic components on a circuit substrate. Substrate work system 10 is configured from four electronic component mounting devices (hereinafter sometimes referred to as "mounting devices") 12. The four mounting devices 12 are in a line adjacent to each other. In the following description, the X-axis direction refers to the direction in which mounting devices 12 are lined up, and the Y-axis direction refers to the horizontal direction orthogonal to the X-axis direction.

Figure 2:
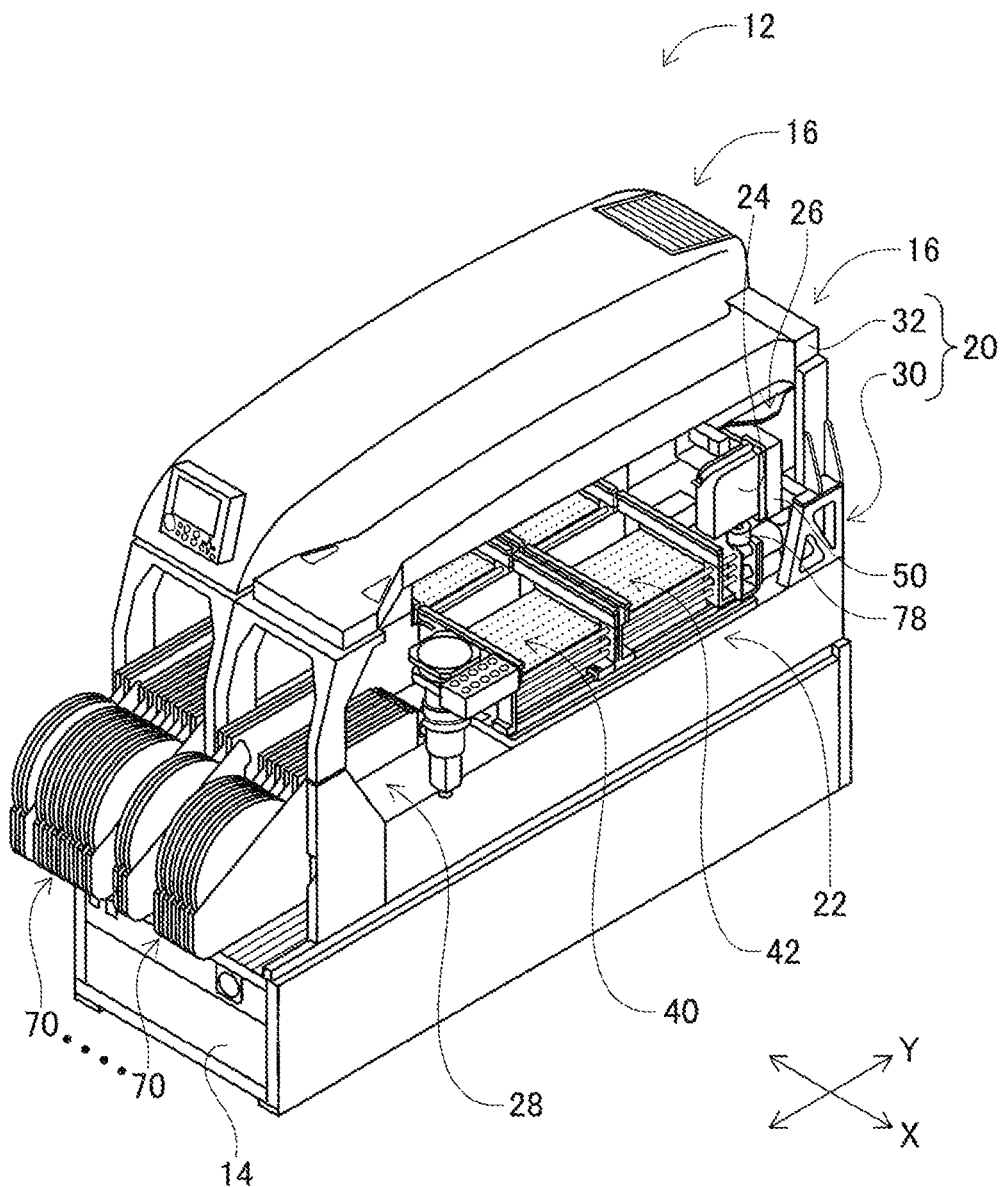
FIG. 2 is a perspective view showing a mounting device of the substrate work system of FIG. 1.

The four mounting devices 12 have substantially the same configuration. For this reason, one of the four mounting devices 12 will be described as an example. As shown in FIG. 2, mounting device 12 includes system base 14, and two mounters 16 arranged adjacent to each other on system base 14. Each mounter 16 primarily includes mounter body 20, conveyance device 22, mounting head 24, mounting head moving device (hereinafter sometimes abbreviated to "moving device") 26, and supply device 28. Mounter body 20 is configured from frame 30 and beam 32 that is mounted on the frame 30.

Conveyance device 22 is provided with two conveyor devices 40 and 42. The two conveyor devices 40 and 42 are parallel to each other and are provided on frame 30 extending in the X-axis direction. Each of the two conveyor devices 40 and 42 conveys circuit substrates held by conveyor device 40 and 42 in the X-axis direction using electromagnetic motor (refer to FIG. 3) 46. Also, the circuit substrate is fixedly held at a predetermined position by board holding device (refer to FIG. 3) 48.

Moving device 26 is an XY robot type moving device. Moving device 26 is provided with electromagnetic motor (refer to FIG. 3) 52 that slides slider 50 in the X-axis direction, and electromagnetic motor (refer to FIG. 3) 54 that slides slider 50 in the Y-axis direction. Mounting head 24 is attached to slider 50, and mounting head 24 is moved to any position on frame 30 by the operation of the two electromagnetic motors 52 and 54.

Supply device 28 is a feeder type supply device and is provided on the front end of frame 30. Supply device 28 has tape feeders 70. Tape feeders 70 house taped components in a wound state. Taped components are electronic components that have been put into tape. Tape feeders 70 deliver the taped components using indexing device (refer to FIG. 3) 76. Accordingly, feeder type supply device 28 supplies an electronic component to a supply position through the feeding delivery of the taped components. Tape feeders 70 can be removed from and attached to frame 30 to facilitate the exchange of electronic components and so on.

Mounting head 24 mounts electronic components on a circuit substrate. Mounting head 24 includes suction nozzle 78 that is provided on a lower end face of the mounting head. Suction nozzle 78 is connected to positive/negative pressure supply device (refer to FIG. 3) 80 via a negative pressure air/positive pressure air supply passage. Suction nozzle 78 picks up and holds an electronic component using negative pressure, and releases the held electronic component using positive pressure. Also, mounting head 24 has nozzle raising/lowering device (refer to FIG. 3) 82 that raises/lowers suction nozzle 78. Mounting head 24 changes the position of the held electronic component in a vertical direction by nozzle raising/lowering device 82. Note that, suction nozzles 78 can be attached to and removed from mounting head 24, and can be changed based on things such as the size and shape of the electronic components.

Figure 3:
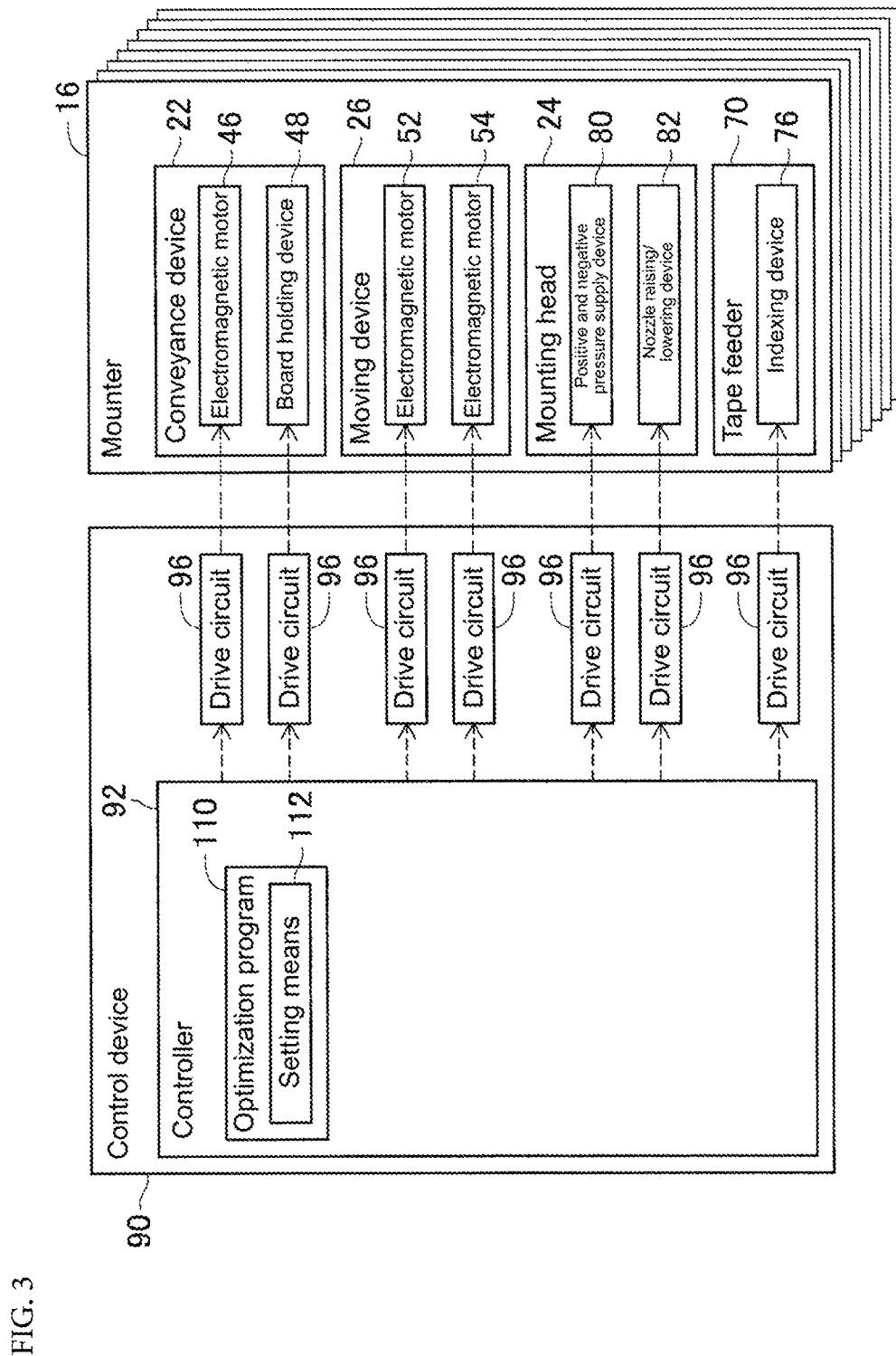
FIG. 3 is a block diagram showing a control device of the substrate work system.

Also, as shown in FIG. 3, substrate work system 10 is provided with control device 90. Control device 90 is provided with controller 92 and multiple drive circuits 96. Multiple drive circuits 96 are connected to electromagnetic motors 46, 52, and 54, substrate holding device 48, indexing device 76, positive/negative pressure supply device 80, and nozzle raising/lowering device 82. Controller 92 is provided with a CPU, ROM, RAM, and so on, is formed mainly from a computer, and is connected to the multiple drive circuits 96. By this, operation of conveyance device 22, moving device 26, and so on is controlled by controller 92.

Mounting Work by the Substrate Work System

In substrate work system 10 configured as above, circuit substrates are conveyed by conveyance device 22 inside the eight mounters 16, and electronic components are mounted on the circuit substrates by each mounter 16.

Specifically, first, a circuit substrate is loaded into the mounter 16 arranged at the most upstream position of the eight mounters 16. Then, based on commands of controller 92, the circuit substrate is conveyed to a work position, and fixedly held at that position by substrate holding device 48. Also, based on commands of controller 92, tape feeders 70 feed taped components and supply electronic components to supply positions. Then, based on commands of controller 92, mounting head 24 moves above the supply position of the electronic component and picks up and holds the electronic component using suction nozzle 78. Continuing, mounting head 24 moves above the circuit substrate and mounts the held electronic component on the circuit substrate. When work of mounting electronic components on the circuit substrate is complete, the circuit substrate is conveyed downstream and loaded into mounter 16 positioned on the downstream side. The above work is performed consecutively at each mounter 16 to produce circuit substrates mounted with electronic components.

Setting mounting work procedure for multiple-board substrates With substrate work system 10, production of circuit substrates is performed according to the above procedure; because multiple electronic components are mounted on a circuit substrate, mounting work of mounting multiple electronic components on the circuit substrate is divided between each of the multiple mounters 16 that configure substrate work system 10. In other words, mounting procedures for mounting the multiple electronic components on the circuit substrate (hereinafter also referred to simply as "mounting procedure") are set as work data to the multiple mounters 16. Described below is a work procedure when a circuit substrate being produced is a multiple-board substrate. Multiple-board substrates are provided with multiple boards on one circuit substrate, in which multiple electronic circuit board patterns (hereinafter referred to as "circuit pattern") on which multiple electronic components are to be mounted are provided; specifically, for example, on multiple-board substrate 100 shown in FIG. 4, there are three circuit patterns 102, with nine electronic components 104 mounted on each circuit pattern 102.

Substrate work system 10 includes eight mounters 16; to describe setting a work procedure to the eight mounters 16 would be very complex, so description is given of setting a work procedure for three mounters 16 that perform mounting work with respect to multiple-board substrate 100. To distinguish between the three mounters 16, they are sometimes referred to as first mounter 16*a*, second mounter 16*b*, and third mounter 16*c*. Also, to distinguish between the three circuit patterns 102, they are sometimes referred to as first circuit pattern 102*a*, second circuit pattern 102*b*, and third circuit pattern 102*c*. Further, to distinguish between the nine electronic components 104, they are sometimes referred to as first electronic component 104*a*, second electronic component 104*b*, third electronic component 104*c*, fourth electronic component 104*d*, fifth electronic component 104*e*, sixth electronic component 104*f*, seventh electronic component 104*g*, eighth electronic component 104*h*, and ninth electronic component 104*i*.

When setting a work procedure of multiple-board substrate 100 provided with three circuit patterns 102 for three mounters 16, for example, a work procedure for nine electronic components 104 to first circuit pattern 102*a* may be set to first mounter 16*a*, a work procedure for nine electronic components 104 to second circuit pattern 102*b* may be set to second mounter 16*b*, and a work procedure for nine electronic components 104 to third circuit pattern 102*c* may be set to third mounter 16*c*. That is, a work procedure for electronic components surrounded by the dashed line in FIG. 4 may be set to first mounter 16*a*, a work procedure for electronic components surrounded by the single-dashed solid line in FIG. 4 may be set to second mounter 16*b*, and a work procedure for electronic components surrounded by the double-dashed solid line in FIG. 4 may be set to third mounter 16*c*. By setting work procedures to the three mounters 16 in this manner, the work range for each mounter 16 is made small, thus improving throughput.

However, there are cases in which one or more of the three circuit patterns 102 of multiple-board substrate 100 is a defective circuit pattern. In this case, mounting work is not performed with respect to defective circuit pattern (hereinafter sometimes referred to as "defective circuit pattern) 102. That is, in a case in which second circuit pattern 102 is a defective circuit pattern, mounting work is performed by first mounter 16*a* and third mounter 16*c* without being performed by second mounter 16*b*. Thus, the throughput of substrate work system 10 can be thought to improve due to mounting work not being performed by second mounter 16*b*. However, because circuit boards are consecutively loaded into substrate work system 10, an upstream mounter 16 cannot convey a new circuit substrate to a downstream mounter 16 until the downstream mounter 16 has completed mounting work. That is, even though mounting work is not being performed by second mounter 16*b*, second mounter 16*b* cannot convey a new circuit substrate to third mounter 16*c* until mounting work by third mounter 16*c* has been completed, and thus second mounter 16*b* is in a standby state. In such cases, because second mounter 16*b* is in a standby state in cases in which mounting work is not performed by second mounter 16b due to the presence of a defective circuit pattern, the throughput of substrate work system 10 basically does not improve.

Figure 5A:
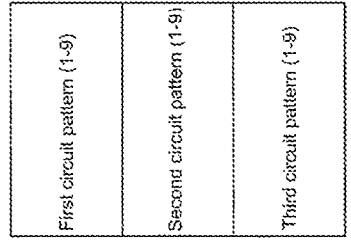
FIG. 5A is a conceptual diagram showing the method for setting the mounting work procedure for multiple mounters when mounting electronic components to multiple-board substrates.

Considering this, with substrate work system 10, when there is a defective circuit pattern, setting of a work procedure is performed such that throughput of substrate work system 10 improves. Specifically, all work procedures with respect to multiple-board substrate 100 are divided by each circuit pattern 102. Accordingly, as shown in FIG. 5A, work procedures are divided into three groups. Note that, "X-th circuit pattern (1-9)" indicates the work procedures for first electronic component 104a to ninth electronic component 104i scheduled to be mounted on each circuit pattern 102. That is, "first circuit pattern (1-9)" indicates the work procedures for first electronic component 104a to ninth electronic component 104i scheduled to be mounted on first circuit pattern 102a.

Figure 5B:
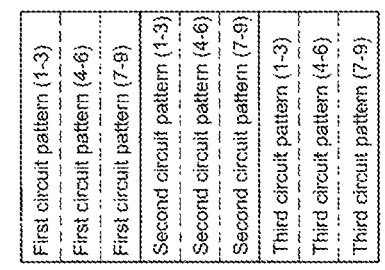
FIG. 5B is a conceptual diagram showing the method for setting the mounting work procedure for multiple mounters when mounting electronic components to multiple-board substrates.

Next, work procedures for each circuit pattern 102 are divided equally between all of the mounters 16 that are to perform mounting work, in this case, three mounters 16. By this, as shown in FIG. 5B, nine work procedures for each circuit pattern 102 are divided into three groups, and each group contains three work procedures. Note that, "X-th circuit pattern (1-3)" in the figure indicates the work procedures for first electronic component 104a to third electronic component 104c scheduled to be mounted on each circuit pattern 102, "X-th circuit pattern (4-6)" in the figure indicates the work procedures for fourth electronic component 104d to sixth electronic component 104f scheduled to be mounted on each circuit pattern 102, and "X-th circuit pattern (6-9)" in the figure indicates the work procedures for seventh electronic component 104g to ninth electronic component 104i scheduled to be mounted on each circuit pattern 102.

Figure 5C:
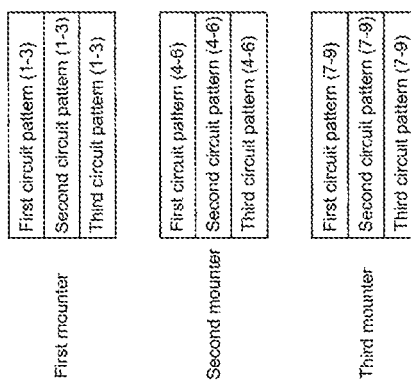
FIG. 5C is a conceptual diagram showing the method for setting the mounting work procedure for multiple mounters when mounting electronic components to multiple-board substrates.

Further, work procedures of each circuit pattern 102 divided into three groups are distributed between the three mounters 16. Here, work procedures from each circuit pattern 102 are distributed between mounters 16 such that mounting positions of electronic components 104 are shared. By this, as shown in FIG. 5C, the work procedures for first electronic component 104a to third electronic component 104c scheduled to be mounted on each circuit pattern 102 are set to first mounter 16a, the work procedures for fourth electronic component 104d to sixth electronic component 104f scheduled to be mounted on each circuit pattern 102 are set to second mounter 16b, and the work procedures for seventh electronic component 104g to ninth electronic component 104i scheduled to be mounted on each circuit pattern 102 are set to third mounter 16c.

Figure 6:
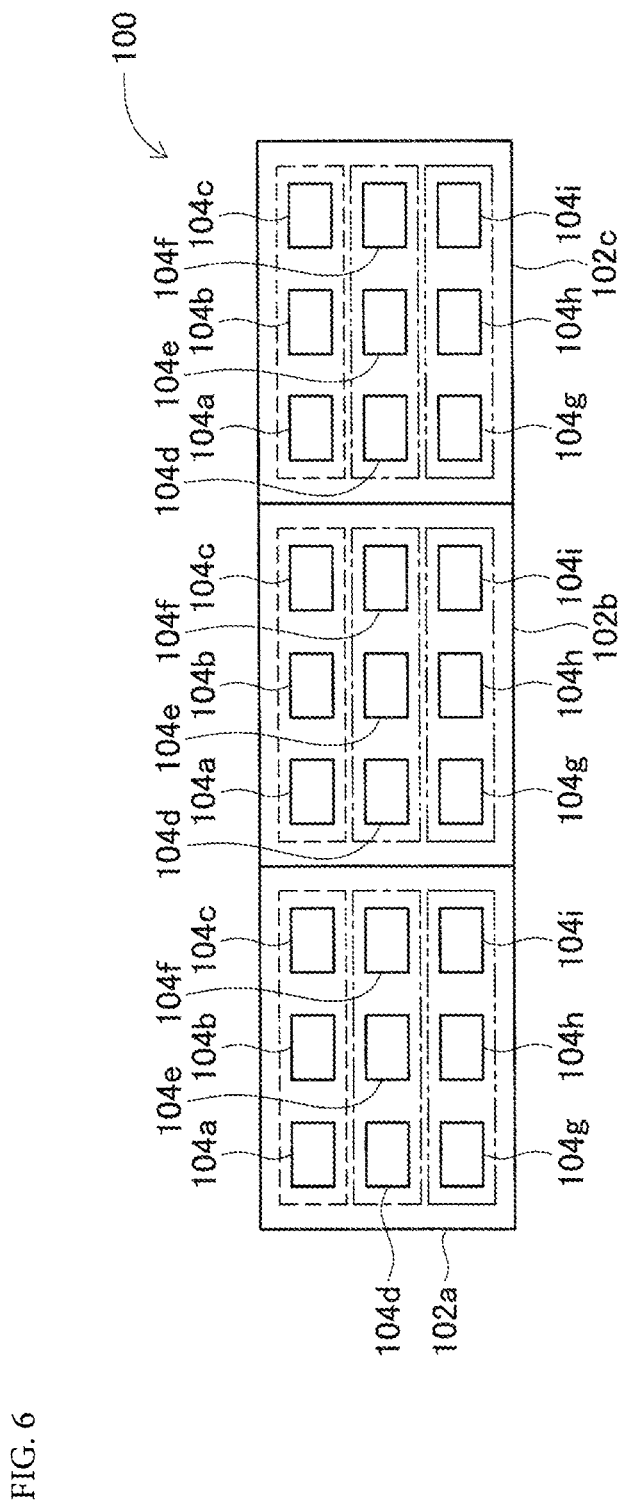
FIG. 6 is a plan view showing a multiple-board substrate for which mounting work is to be performed according to the mounting work procedure set by the method shown in FIG. 5.

When setting work procedures in this manner, as shown in FIG. 6, work procedures for first electronic component 104a to third electronic component 104c surrounded by the dashed lines in FIG. 6 correspond to mounting work by first mounter 16a, work procedures for fourth electronic component 104d to sixth electronic component 104f surrounded by the single-dashed solid lines in FIG. 6 correspond to mounting work by second mounter 16b, and work procedures for seventh electronic component 104g to ninth electronic component 104i surrounded by the double-dashed solid lines in FIG. 6 correspond to mounting work by third mounter 16c. That is, each mounting work for the multiple electronic components 104 for each circuit pattern 102 is performed by all the mounters 16.

In this manner, when setting work procedures for a multiple-board substrate 100, if a defective circuit pattern is present on a multiple-board substrate 100, the throughput of substrate work system 10 improves by not performing mounting work with respect to the defective circuit pattern. Specifically, for example, in a case in which second circuit pattern 102b is a defective circuit pattern, first mounter 16a performs mounting work for first electronic component 104a to third electronic component 104c for first circuit pattern 102a and third circuit pattern 104c without performing mounting work for first electronic component 104a to third electronic component 104c for second circuit pattern 102b. Also, second mounter 16b performs mounting work for fourth electronic component 104d to sixth electronic component 104f for first circuit pattern 102a and third circuit pattern 104c without performing mounting work for fourth electronic component 104d to sixth electronic component 104f for second circuit pattern 102b. Also, third mounter 16b performs mounting work for seventh electronic component 104g to ninth electronic component 104i for first circuit pattern 102a and third circuit pattern 104c without performing mounting work for seventh electronic component 104g to ninth electronic component 104i for second circuit pattern 102b. That is, at each mounter 16, mounting work is performed for first circuit pattern 102a and third circuit pattern 102c, and mounting work is not performed for second circuit pattern 102b. Thus, theoretically, the tact time of substrate work system 10 is reduced by the work time required for second circuit pattern 102b. In this manner, in substrate work system 10, work procedures are set such that mounting work of mounting multiple electronic components 104 for each circuit pattern 102 is performed by all mounters 16, thereby improving throughput in cases in which there is a defective circuit pattern on a multiple-board substrate 100.

Also, when setting work procedures as above, work procedures for each circuit pattern are divided and divided work procedures are distributed between the multiple mounters 16; however, it is possible to set work procedures by a different method. Specifically, from all the work procedures for multiple-board substrate 100, information related to mounting positions of electronic components to be mounted according to the work procedures (hereinafter sometimes referred to as "reference information") and information related to circuit pattern 102 that is the target for mounting work according to the work procedures (hereinafter sometimes referred to as "circuit pattern information") may be combined and extracted. This combination of extracted reference information and circuit pattern information is shown in FIG. 7A.

"R1-9 (1-3)" in the figure represents a combination of extracted reference information and circuit pattern information. Notation R1~9 represents reference information; for example, R1 represents the electronic component to be mounted according to the work procedures that is first electronic component 104a, and the position at which first electronic component 104a is to be mounted. Also, (1~3) represents circuit pattern information; for example, (1) represents first circuit pattern 102a that is the target for mounting work according to the work procedures. Thus, for example, R1(1) represents the work procedure for mounting an electronic component at the mounting position for first electronic component 104a of first circuit pattern 102a.

When a combination of reference information and circuit pattern information is extracted, that information is classified by each piece of reference information. By this, as shown in FIG. 7B, division into nine groups, R1 to R9, is performed. Then, each of the nine groups of reference information is allocated to the three mounters 16. Here, if the mounting performance of the three mounters 16 is the same, each of the nine groups of reference information should be distributed equally between the mounters 16. That is, three groups each should be distributed to each mounter 16. However, if the mounting performance of each mounter 16 is different, each of the nine groups of reference information should be distributed between the three mounters 16 based on the mounting performance of the mounters 16.

In detail, in a case in which the mounting performance of first mounter 16a, that is, the quantity of electronic components that can be mounted per unit of time is A components per second, the mounting performance of second mounter 16b is 2A components per second, and the mounting performance of third mounter 16c is 6A components per second, the nine groups are distributed between the three mounters 16 with a ratio of 1:2:6. By this, as shown in FIG. 7C, the work procedures for first electronic component 104a scheduled to be mounted on each circuit pattern 102 are set to first mounter 16a, the work procedures for second electronic component 104b and third electronic component 104c scheduled to be mounted on each circuit pattern 102 are set to second mounter 16b, and the work procedures for fourth electronic component 104d to ninth electronic component 104i scheduled to be mounted on each circuit pattern 102 are set to third mounter 16c.

Figure 8:
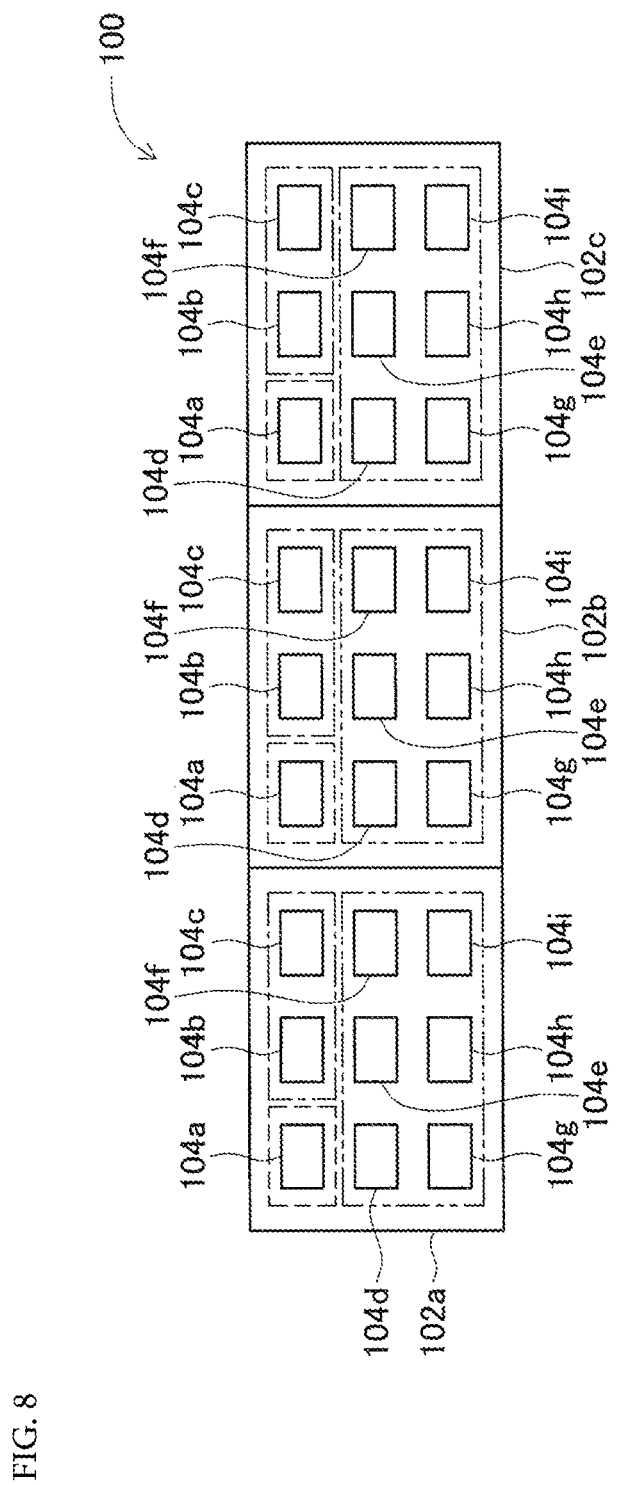
FIG. 8 is a plan view showing a multiple-board substrate for which mounting work is to be performed according to the mounting work procedure set by the method shown in FIG. 7.

When setting work procedures in this manner, as shown in FIG. 8, work procedures for first electronic components 104a surrounded by the dashed lines in FIG. 8 correspond to mounting work by first mounter 16a, work procedures for second electronic components 104b and third electronic components 104c surrounded by the single-dashed solid lines in FIG. 8 correspond to mounting work by second mounter 16b, and work procedures for fourth electronic components 104d to ninth electronic components 104i surrounded by the double-dashed solid lines in FIG. 8 correspond to mounting work by third mounter 16c.

The same effects are achieved by setting work procedures in this manner as for the work procedures described earlier. Further, with this setting of work procedures, the mounting performance of mounters 16 is considered. Thus, for example, even in a case in which substrate work system 10 is configured from multiple types of mounters, it is possible to substantially equalize the time required for work for each mounter 16, thus shortening the tact time of substrate work system 10.

Figure 4:
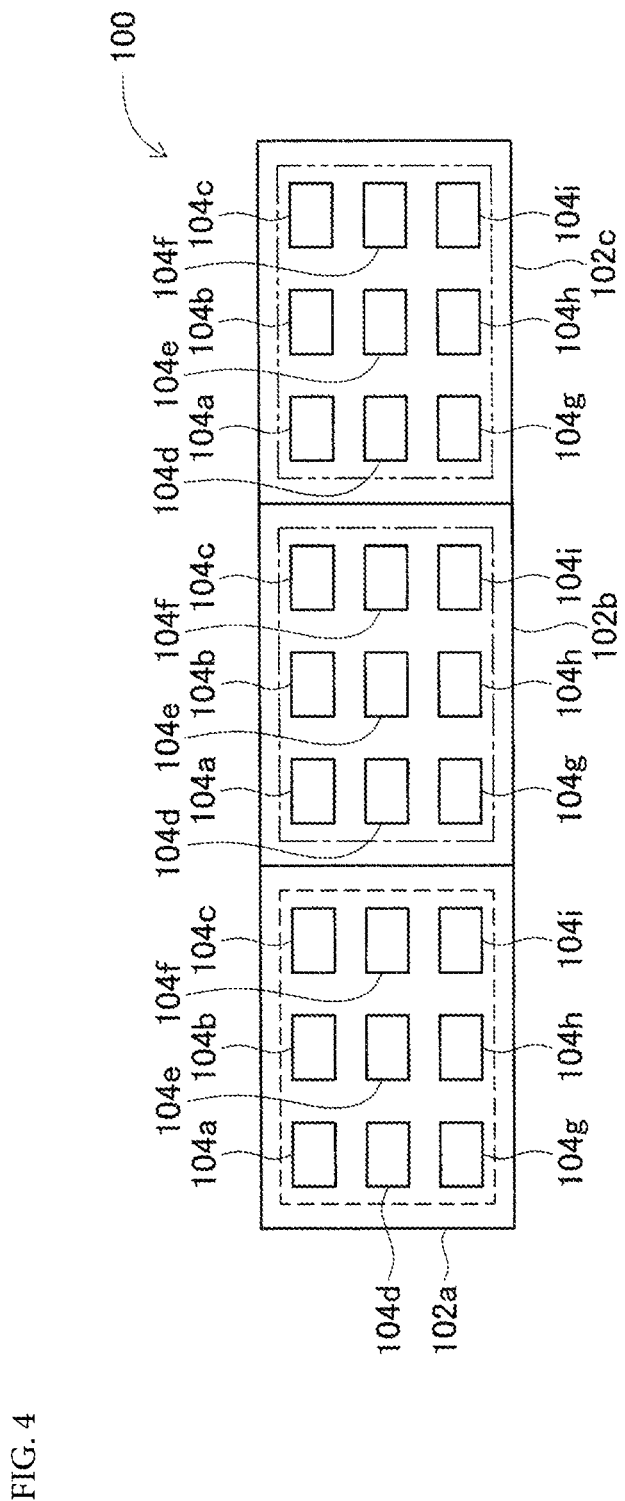
FIG. 4 is a plan view of a multiple-board substrate.

Note that, according to the above setting of work procedures, the effect of improving the throughput when there is a defective circuit pattern on multiple-board substrate 100 should be quantified, thus the applicant calculated the time required to manufacture one multiple-board substrate (hereinafter sometimes referred to as "work time") via simulation. Shown in FIG. 9 are the work times in a case when setting work procedures according to a conventional method, that is, as shown in FIG. 4, when setting work procedures such that mounting work of one circuit pattern 102 is performed by one mounter 16. Shown in FIG. 10 are the work times in a case when setting work procedures according to a method used by substrate work system 10, that is, as shown in FIGS. 6 and 8, when setting work procedures such that mounting work of each circuit pattern 102 is performed by all the mounters 16.

In the figures, work times are displayed for mounting work for five different types of electronic component mounting (JOB1 to JOB5), with the work times displayed for each of the top surfaces (Top) and bottom surfaces (Bottom). The "No defective circuit patterns" column shows the work time in a case in which all three circuit patterns 102 on multiple-board substrate 100 are of good condition. The "X-th circuit pattern defective" columns show the work time in a case in which the X-th circuit pattern of the three circuit patterns 102 on multiple-board substrate 100 is defective. The "Average" column shows the average value of the work times for cases in which there is a defective circuit pattern. Finally, the "Reduction ratio" shows the reduction ratio of the work time when there is a defective circuit pattern. The larger the reduction ratio, the shorter the work time is in a case when there is a defective circuit pattern compared to a case when there is no defective circuit pattern, meaning that the throughput when there is a defective circuit pattern improves. Reduction ratio A is calculated as given below.

$$A=\{(\text{"work time when there is no defective circuit pattern"}-\text{"average work time when there is a defective circuit pattern"})/\text{"work time when there is no defective circuit pattern"}\}\times 100$$

As shown in the figures, when settings work procedures according to a conventional method, reduction ratios are approximately 3 to 11%. On the other hand, when setting work procedures according to a method used by substrate work system 10, reduction ratios are approximately 24 to 33%. In this manner, by setting work procedures according to a method used by substrate work system 10, throughput when there is a defective circuit pattern is substantially improved.

Note that, the above setting of work procedures is performed by optimization program (refer to FIG. 3) 110 memorized in controller 92. As shown in FIG. 3, optimization program 110 has setting device 112 that functions as a section for performing setting of work procedures for each mounter 16.

Note that, in the above embodiment, substrate work system 10 is an example of a substrate work system. Mounter 16 is an example of a mounting work machine. Control device 90 is an example of a control device. Multiple-board substrate 100 is an example of a multiple-board printed panel. Circuit pattern 102 is an example of an electronic circuit board pattern. Optimization program 110 is an example of an optimization program. Setting device 112 is an example of a setting device.

Further, this disclosure is not limited to the above example embodiments, and various changed or improved methods of embodiment are possible based on the knowledge of someone skilled in the art. Specifically, for example, in the above embodiment, optimization program 110 is provided in control device 90 that controls operations of substrate work system 10 and control device 90 performs setting of work procedures, however, optimization program 110 may be provided in a device different to control device 90, and setting of work procedures may be performed by the different device.

REFERENCE SIGNS LIST

10: substrate work system (mounting work system); 16: mounter (mounting work machine); 90: control device (memory device); 100: multiple-board substrate (multiple-board printed panel); 102: circuit pattern (electronic circuit board pattern); 110: optimization program; 112: setting device

The invention claimed is:

1. A method for mounting electronic components in a mounting work system provided with multiple mounting work machines lined up in a row with multiple-board printed panels being conveyed in the mounting work system from an upstream side of the multiple mounting work machines to a downstream side and each of the multiple-board printed panels being defined as a panel with multiple boards on one circuit substrate, in which multiple electronic circuit board patterns, on which multiple of the electronic components are to be mounted, are provided, the method comprising:

setting a mounting work procedure of mounting the multiple electronic components to each of the electronic circuit board patterns for each of the multiple mounting work machines such that work of mounting the multiple electronic components onto each of the multiple electronic circuit board patterns is performed by all of the multiple mounting work machines including that:

a first mounting work machine of the multiple mounting work machines mounts a first subset of the multiple electronic components onto corresponding mounting positions of the first subset of the multiple electronic components on each of the multiple electronic circuit board patterns of the multiple-board printed panels, a second mounting work machine of the multiple mounting work machines mounts a second subset of the multiple electronic components onto corresponding mounting positions of the second subset of the multiple electronic components on each of the multiple electronic circuit board patterns of the multiple-board printed panels, and a first total time for work of the first mounting work machine mounting the first subset of the electronic components to each of the multiple electronic circuit board patterns is equalized with a second total time for work of the second mounting work machine mounting the second subset of the electronic components to each of the multiple electronic circuit board patterns;

storing the work mounting procedure to a memory; and controlling the multiple mounting work machines to mount the electronic components on the multiple-board printed panels according to the mounting work procedure.

2. The method according to claim 1, further comprising:
setting the mounting work procedure according to a quantity of the electronic components per unit of time to be mounted to each of the electronic circuit board patterns by each of the multiple mounting work machines.

3. A mounting work system comprising:
multiple mounting work machines lined up in a row: and
a control device configured to control operation of the multiple mounting work machines, wherein multiple-board printed panels are conveyed in the mounting work system from an upstream side of the multiple mounting work machines to a. downstream side, each of the multiple-board printed panels being defined as a panel with multiple boards on one circuit substrate, in which multiple electronic circuit board patterns, on which multiple of electronic components are to be mounted, are provided, and wherein the control device is configured to control the operation of the multiple mounting work machines according to a mounting work procedure of mounting the multiple electronic components to each of the electronic circuit board patterns for each of the multiple mounting work machines such that work of mounting the multiple electronic components onto each of the multiple electronic circuit board patterns is performed by all of the multiple mounting work machines including that:

a first mounting work machine of the multiple mounting work machines mounts a first subset of the multiple electronic components onto corresponding mounting positions of the first subset of the multiple electronic components on each of the multiple electronic circuit board patterns of the multiple-board printed panels, a second mounting work machine of the multiple mounting work machines mounts a second subset of the multiple electronic components onto corresponding mounting positions of the second subset of the multiple electronic components on each of the multiple electronic circuit board patterns of the multiple-board printed panels, and a first total time for work of the first mounting work machine mounting the first subset of the electronic components to each of the multiple electronic circuit board patterns is equalized with a second total time for work of the second mounting work machine mounting the second subset of the electronic components to each of the multiple electronic circuit board patterns.

4. The work mounting system according to claim 3, wherein the work mounting procedure is set according to a quantity of electronic components per unit of time to be mounted to each of the electronic circuit board patterns by each of the multiple mounting work machines.

* * * * *